(12) United States Patent
Taheri et al.

(10) Patent No.: US 7,215,214 B1
(45) Date of Patent: May 8, 2007

(54) RESONATOR AND AMPLIFYING OSCILLATOR CIRCUIT HAVING A HIGH RESOLUTION SKEW-COMPENSATED FREQUENCY SYNTHESIZER INTEGRATED ON A SINGLE SUBSTRATE

(75) Inventors: Babak Taheri, San Francisco, CA (US); Steve Whelan, San Diego, CA (US); Greg Richmond, Sunnyvale, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 10/890,005

(22) Filed: Jul. 13, 2004

Related U.S. Application Data (60) Provisional application No. 60/506,233, filed on Sep. 26, 2003.

(51) Int. Cl.
*H03B 9/12* (2006.01)
(52) U.S. Cl. .................. 331/107 A; 331/155; 310/315
(58) Field of Classification Search ................ 331/155, 331/107 A; 310/315
See application file for complete search history.

(56) References Cited

U.S. PATENT DOCUMENTS

| | | | |
|---|---|---|---|
| 3,886,504 A | 5/1975 | Hartmann et al. | |
| 5,265,267 A | 11/1993 | Martin et al. | |
| 5,932,953 A * | 8/1999 | Drees et al. | ................. 310/324 |
| 6,285,866 B1 | 9/2001 | Lee et al. | |
| 6,603,364 B2 | 8/2003 | Nemoto | |
| 6,606,006 B1 | 8/2003 | Alexandersson | |
| 2002/0127984 A1* | 9/2002 | Barak | ....................... 455/183.2 |
| 2004/0203528 A1* | 10/2004 | Ammar et al. | ............. 455/90.3 |

OTHER PUBLICATIONS

Baca et al., "Development of a GaAs Monolithic Surface Acoustic Wave Integrated Circuit," IEEE Journal of Solid-State Circuits, vol. 34, No. 9, Sep. 1999, pp. 1254-1258.

* cited by examiner

*Primary Examiner*—Joseph Chang
(74) *Attorney, Agent, or Firm*—Kevin L. Daffer; Daffer McDaniel, LLP (57) ABSTRACT

An oscillator circuit is provided having an oscillating amplifier circuit connected to a resonator. The oscillator/amplifier and resonator are preferably fabricated on a single die using semiconductor fabrication tools. Included with the circuitry is a temperature sensor or transducer, an execution unit, non-volatile memory, a modulator, and frequency synthesizer, all of which are integrated together on the substrate, along with the piezoelectric crystal resonator. The frequency synthesizer can preferably include a phase-locked loop with a divider that is in a feedback loop of the phase-locked loop, in which a divide-by value is received from a modulator that achieves finer and higher resolution frequency selectivity from the voltage-controlled oscillator, also within the phase-locked loop, as an output from the crystal oscillator.

8 Claims, 4 Drawing Sheets

RESONATOR AND AMPLIFYING OSCILLATOR CIRCUIT HAVING A HIGH RESOLUTION SKEW-COMPENSATED FREQUENCY SYNTHESIZER INTEGRATED ON A SINGLE SUBSTRATE

PRIORITY APPLICATION

This application claims priority to Provisional Application No. 60/506,233 entitled "Universal Oscillator Replacement," filed Sep. 26, 2003 and incorporated herein in its entirety.

BACKGROUND OF THE INVENTION

1. Field of the Invention

The present invention relates to a piezoelectric resonator coupled to an oscillating amplifier ("crystal oscillator") and, more specifically, to a crystal oscillator embodied on the same monolithic substrate as a frequency synthesizer to offset any frequency skewing caused by, for example, temperature or fabrication process fluctuations.

2. Description of the Related Art

The following descriptions and examples are not admitted to be prior art or conventional by virtue of their inclusion within this section.

Within nearly every electronic subsystem is some sort of generator that produces cyclical waveforms. The waveform generator is oftentimes referred to as an oscillator that produces a regular oscillation voltage or current. Depending on the application, an oscillator can be used to source regularly-spaced pulses or clock signals. Oscillators are generally rated depending on their stability and accuracy, frequency adjustability (i.e., tunability), and power consumption.

There are numerous types of oscillators in the marketplace. A simple kind of oscillator is an RC relaxation oscillator. A more stable and accurate oscillator, however, involves the use of a piezoelectric resonator, oftentimes referred to simply as a piezoelectric crystal or "crystal." A crystal implements the piezoelectric effect of converting mechanical vibrations into electrical impulses and vice-versa. If alternating currents or voltages are applied to the crystal, it will vibrate at a resonant frequency, and harmonic modes thereof. To initiate and amplify the piezoelectric effect, a circuit is coupled to the crystal and generally consists of an amplifier with feedback. The frequency of feedback is governed by the low impedance, resonant frequency of the crystal, and the resonant frequency (with harmonics) is governed by the type of crystal used, the orientation angle at which the crystal is formed or cut, and the transducer used to convert acoustic waves in the crystal to electrical impulses and vice-versa.

While there are many types of piezoelectric resonators, there are also many types of oscillating amplifiers coupled to the resonator. For example, the oscillator can be voltage-controlled. Crystal-based oscillators are oftentimes referred to as a voltage-controlled crystal oscillators or VCXOs. A voltage-controlled crystal oscillator can be thought of as an oscillator that can "pull" the frequency of the resonator to a different frequency from that of the resonating frequency. One mechanism used to pull the frequency is to impart an external voltage onto a varactor. The varactor can be coupled to one or both terminals of the resonator to adjust the capacitive value on the inputs. Alternatively, the varactor can be arranged as a bank of selectively coupled capacitors, whose capacitive value is adjusted by, for example, a digital signal.

In addition to voltage-controlled crystal oscillators, many crystal oscillators (XO) can also be temperature compensated. It is generally well known that piezoelectric resonators shift slightly in frequency as the operating temperature changes. In order to compensate for the frequency shift, temperature readings must be taken from the resonator, and the output from the voltage-controlled crystal oscillator must be shifted to offset the temperature skew. Thus, the frequency output from the voltage-controlled crystal oscillator can be pulled to another frequency to minimize, if not eliminate, frequency skewing caused by temperature changes.

To take into account temperature fluctuations, many conventional solutions employ a crystal oven. By placing the crystal into an oven separate and apart from the amplifier/oscillator circuit, the resonator is maintained at a constant temperature with little, if any, resonant frequency fluctuations. Alternatively, a temperature sensor can be coupled to the resonator and electrical leads extending from the resonator case to the amplifier/oscillator circuit that is spaced from the resonator. In each solution, however, the piezoelectric resonator must be housed in a specifically designed package outside of and external to an integrated circuit on which the oscillator/amplifier is formed. Electrical leads from the temperature sensor thereby extend along relatively long capacitive- and inductive-loaded leads to a separately packaged integrated circuit in which the amplifier is located.

As described herein, an integrated circuit is one that is formed on a single, monolithic substrate. The integrated circuit is formed by dicing die from a wafer and then packaging a dice removed from the wafer within a package containing leads extending from the package. Typical voltage-controlled crystal oscillators or temperature-controlled crystal oscillators (TCXO) utilize an integrated circuit on which the amplifying oscillator circuit is arranged in an integrated circuit that is separate from the piezoelectric resonator, where both are coupled by trace conductors extending from a lead of one package to the other. In addition to the loading of the temperature readings through a relatively lengthy set of trace conductor leads, and sensors placed on the external case of the resonator (rather than on the resonator itself), other disadvantages might exist. For example, the amount by which the frequency can be pulled in a typical solution is somewhat limited.

It may be desirable to change the output frequency from the oscillator by either programming the oscillator during its manufacture or possibly in the field with a more variable and flexible frequency outcome. It may also be desirable to implement field and mask programmability not only in a voltage-controlled crystal oscillator, but also for use in a temperature-controlled crystal oscillator where extremely small temperature fluctuations can be accounted for using a high resolution programmable table, modulator, and feedback dual or multi-modulus divider.

In addition to the desirability of having a more tunable output frequency that takes into account temperature fluctuations, it would also be desirable to introduce the temperature sensor directly onto the resonator and integrating the resonator onto, partially within, or within the same substrate which bears the amplifying oscillator circuit. This will shorten leads between the resonator and associated circuitry, as well as lessen the loading effects of the conventionally long leads and the deleterious, somewhat inaccurate readings taken from distally-coupled temperature sensors.

SUMMARY OF THE INVENTION

The problems outlined above are in large part solved by fabricating the resonator within or onto the same substrate in which the amplifier/oscillator circuit is formed. The substrate can be either single crystalline silicon or gallium arsenide. The resonator can be made of either quartz arranged at different angles to produce different vibrational modes (i.e., AT, BT, CT, MT, XT, or DT). Alternatively, the resonator can be made of gallium arsenide, ST quartz, $LiNbO_3$, $LiTaO_3$, or FBAR (ZnO). In the former instance, the quartz crystal includes two faces or surfaces on which leads are internally connected. If placed on the same substrate as the amplifying oscillator, the quartz crystal is not packaged in a separate metal case as in conventional designs, yet is placed as part of the deposition process, possibly followed by a polish process, and/or at least partially within a silicon or gallium arsenide substrate which bears the amplifier/oscillator. In the latter instance, the resonator can include metal conductors extending as a comb-shaped or as an inter-digit transducer (IDT) across an upper surface of the resonator.

The IDT will impart mechanical stress and receive readings across a surface of the piezoelectric resonator. Such technique is hereinafter referred to as a surface acoustic wave (SAW) resonator. Similar to a quartz crystal that uses leads internally connected to two, possibly opposing, faces of the quartz to impart bulk resonation, SAW imparts surface resonation. Both the bulk quartz crystal resonators and SAW resonators can be formed as part of the fabrication process which forms the amplifier/oscillator. Thus, regardless of whether a quartz crystal or SAW is used, either type of resonator can be fabricated as part of the integrated circuit formation, on a single monolithic substrate, partially concurrent with forming the amplifier/oscillator on that substrate.

The crystal oscillator is preferably a voltage-controlled crystal oscillator with temperature compensation. Temperature readings are taken directly from the resonator and routed a relatively short distance across the monolithic substrate to an execution unit, for example. The execution unit can fetch a lookup table (calibration parameters) from memory also possibly configured on the substrate. The temperature readings thereby form an address that draws a compensating value from the lookup table. The compensating value can then be modulated by, for example, a delta-sigma modulator also configured on the substrate. Dependent on the amount of resolution desired, M number of bits can be forwarded to the modulator to produce $2^M$ number of maximum logic 1 voltage values fed from a bitstream output from the modulator to, for example, a divider also configured on the substrate. The divider can be a dual or multi-modulus integer divider or a fractional-N divider, where dithering between N and N+1 can set the average divide-by factor to be an integer value.

The divider can be placed in the feedback loop of a phase-locked loop (PLL) also configured on the substrate. The phase frequency detector of the PLL thereby receives non-compensated frequency from either the resonator or an external clock, as well as an integer or fractional divided frequency from the divider circuit. Eventually, the PLL will achieve a locked status. The amount of division will determine the amount by which the frequency is pulled or compensated to offset the skewing that would occur at that particular temperature-sensed reading. Use of a delta sigma modulator to provide higher resolution, coupled with a fractional divider, allows for even small differences in temperature compensation to be accounted for as a corresponding, compensated output frequency. Input to the divider and output from the voltage-controlled and temperature compensated oscillator, forms the compensated output frequency signal. The output can be further divided or multiplied and chosen as an output from a multiplexer.

The execution unit or CPU memory with lookup table, modulator, and PLL with fractional or integer divider feedback thereby operate together to form the high resolution, temperature compensated output signal frequency. The frequency synthesizer is embodied on the same monolithic substrate as the resonator. If chosen, the resonator can be configured separate from and thereby outside of the die or integrated circuit that embodies the amplifier/oscillator. However, it is preferred for reasons stated above that the resonator be formed as part of the amplifier/oscillator in order to achieve tighter controls for the temperature sensor and loading effect of temperature reading, as well as frequency output from the resonator to the amplifier/oscillator.

While temperature represents one type of condition value that can be sensed, there are other condition values that can also be sensed, each of which have an effect on the low impedance resonating frequency output from the resonator. For example, in addition to temperature, process fluctuations might change the resonant frequency. Although attempts are made in producing quartz crystals identical to one another, either internal defects in the crystalline lattice or defects in the way in which the bulk is fabricated or polished, will produce different resonating frequencies. It might be desirable to model those resonating frequencies by taking frequency readings via the sensor, and offsetting any skew from a measured, benchmarked (or ideal) quartz crystal by compensating the skew read from a programmable lookup table. In addition to defects in the crystalline structure, there may be defects in the spacing between the inter-digitized transducer of a SAW resonator that can also affect the surface acoustic wavelength and, thus, the resonant frequency. This processing fluctuation can also be sensed and compensated through a programmed model placed into the memory lookup table. Thus, the compensating circuitry thereby compensates not only for temperature fluctuations, but also process fluctuations and others performance-modifying conditions that can be modeled and programmed into the memory.

According to one embodiment, an oscillator is provided. The oscillator includes a monolithic substrate and a resonator arranged in a first portion of the substrate. A sensor is arranged in a second portion of the substrate and, preferably, connected to the resonator for sensing a condition value at which the resonator produces a resonating signal. A frequency synthesizer is arranged in a third portion of the substrate for receiving the resonating signal and the condition value, and for modifying a frequency of the resonating signal based on the condition value. The condition value can, according to one example, be a temperature reading or, alternatively, can be a fabrication reading (voltage, current, resistance, capacitance, etc.) effected by fabrication processes, for example. The fabrication fluctuations can manifest themselves as differing frequency readings.

According to another embodiment, an oscillator is provided that includes a piezoelectric resonator and a sensor coupled to the resonator. A lookup table program stored within the memory is addressable from readings taken from the sensor to produce a compensated value. A modulator, such as a delta-sigma modulator, can receive the compensated value and produce a data stream of logic 1 voltage values and logic 0 voltage values corresponding to a magnitude of the compensated value. A divider is coupled to modify a frequency output from the resonator based on the proportion of logic 1 voltage values to logic 0 voltage values.

According to yet another embodiment, a method is provided for forming an oscillator. The method includes depositing a piezoelectric crystal to a predetermined thickness upon a first portion of a semiconductor substrate. The piezoelectric crystal can be deposited and thereafter polished to achieve the predetermined thickness, for example. Dopants are implanted into the substrate, and films are deposited onto the substrate as those films are selectively etched to arrive at circuit elements formed in a second portion of the semiconductor substrate. Implanting, depositing, and etching can occur partially concurrent with when the piezoelectric crystal is deposited and/or polished, to arrive at an integrated circuit that embodies the piezoelectric crystal, as well as the circuit components of the amplifier/oscillator circuitry.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Figure 1:
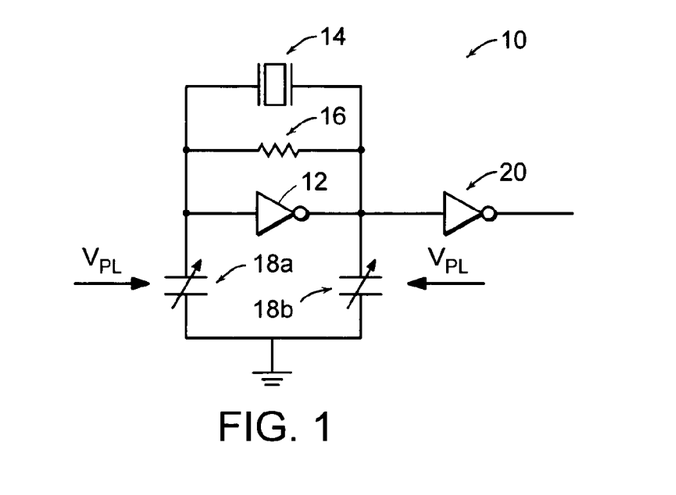
FIG. 1 is a circuit diagram of a voltage controlled crystal oscillator having an oscillator, such as an inverting amplifier, coupled across a piezoelectric resonator.

Turning now to the drawings, FIG. 1 illustrates one exemplary form of a crystal oscillator 10. While it is recognized that there are numerous types or forms of crystal oscillators, oscillator 10 involves one type, often referred to as a Pierce oscillator. However, any oscillator/amplifier circuit connected to a piezoelectric crystal falls within the spirit of this embodiment. For sake of brevity, however, only one form is shown and involves an inverter 12 placed between nodes of a piezoelectric crystal 14. A feedback resistor 16 might be used in connection with the oscillator to bias the input and output oscillating nodes to an appropriate voltage differential.

The frequency of oscillation can be varied if needed by adjusting the capacitive value within an adjustable capacitor or an array of selectively coupled capacitors. Whether adjustable in analog or digital form, the adjustable capacitance value derived from adjustable capacitor (S) 18a and 18b serve to "pull" the frequency of the crystal oscillator. An external voltage ($V_{PL}$) can be applied to the adjustable capacitors 18a and 18b to tune the capacitor value. The external voltage can be sent either as an analog signal or as a digital word to the varactor or capacitor arrays with a bank of switches, respectively. If, for example, a single-ended output, possibly for use as a clocking output, is needed, then a buffer 20 can be used. Buffer 20 can be an inverter circuit similar to inverter 12. A preferred type of inverter with lower power consumption is a complementary metal oxide semiconductor (CMOS) type.

Figure 2:
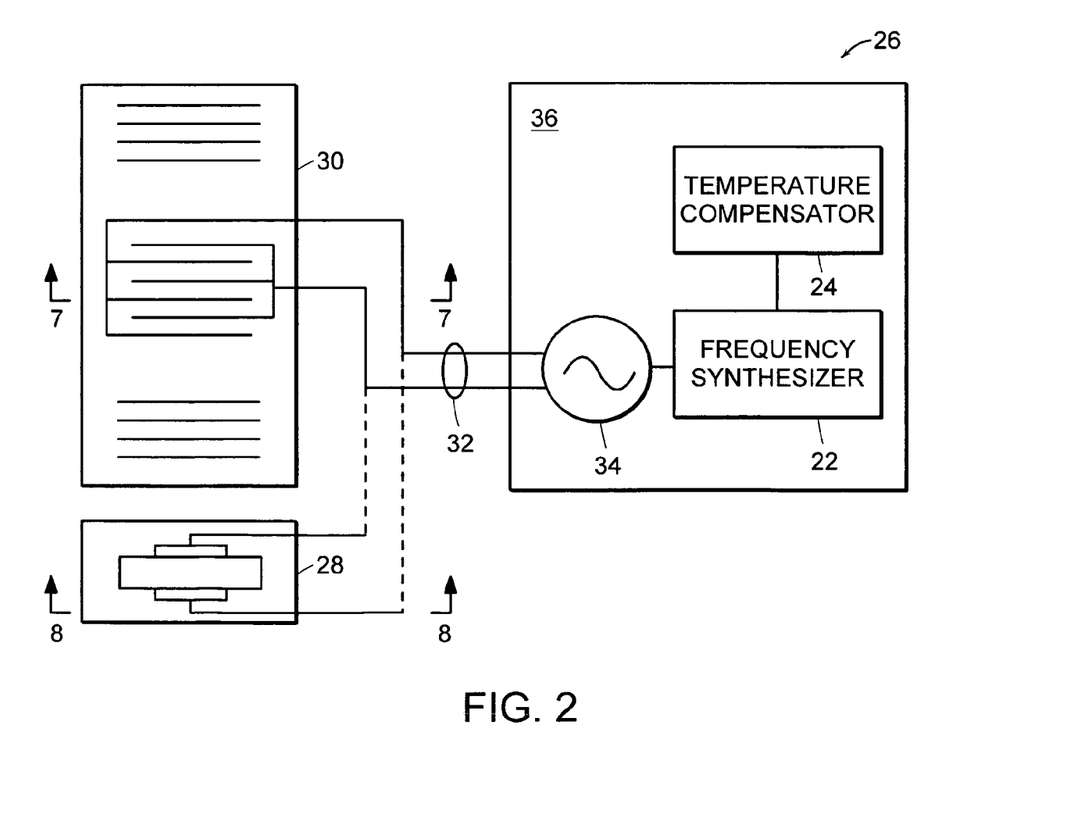
FIG. 2 is a block diagram of a voltage controlled crystal oscillator using a SAW resonator with an inter-digitized transducer (IDT) or a quartz crystal with an opposing face transducer (OFT) coupled to the oscillator.

While the output frequency of oscillator 10 can be pulled through adjustable capacitors 18, the output frequency may necessarily be pulled or "corrected" to even a greater extent using a frequency synthesizer. Thus, in addition to varactors or in lieu of varactors, a frequency synthesizer can be placed at the back end of an oscillator. One advantage of a frequency synthesizer is that conditioning values for resonator 14 can be digitally placed onto the frequency synthesizer, which is programmable to compensate for such values in order to optimize the oscillator output. FIG. 2 illustrates one example of a frequency synthesizer 22 that receives a condition value from a temperature compensator 24.

Referring to FIG. 2, a voltage-controlled oscillator (VCXO) 26 is shown with temperature compensation. The voltage-controlled crystal oscillator or temperature-compensated crystal oscillator (TCXO) can either use a quartz crystal resonator 28 (shown connected in phantom line) or a SAW resonator 30. Typically, either resonator 28 or resonator 30 are arranged in a separate package, usually in metal cases, with leads 32 extending from either resonator 28 or resonator 30 to amplifier/oscillator circuit 34. Circuit 34 can be arranged in the same form as the circuit elements shown in FIG. 1 coupled to wire leads 32 across resonator 14. FIG. 2 illustrates two alternative forms for resonator 14, and illustrates those forms as a SAW resonator 30 or quartz crystal resonator 28.

Conventional crystal oscillators place the discrete metal encased resonators 28 or 30 onto a printed circuit board (or alumina substrate), and connect leads 32 to an integrated circuit 36 containing synthesizer 22, compensator 24, and amplifier/oscillator circuit 34. Fabricating circuit elements 36 and either SAW resonator 30 or quartz crystal resonator 28 on the same substrate using conventional fabrication techniques can provide advantages of integration and low loading effects on leads 32, as well as direct coupling of a sensor onto either form of resonator.

Figure 3:
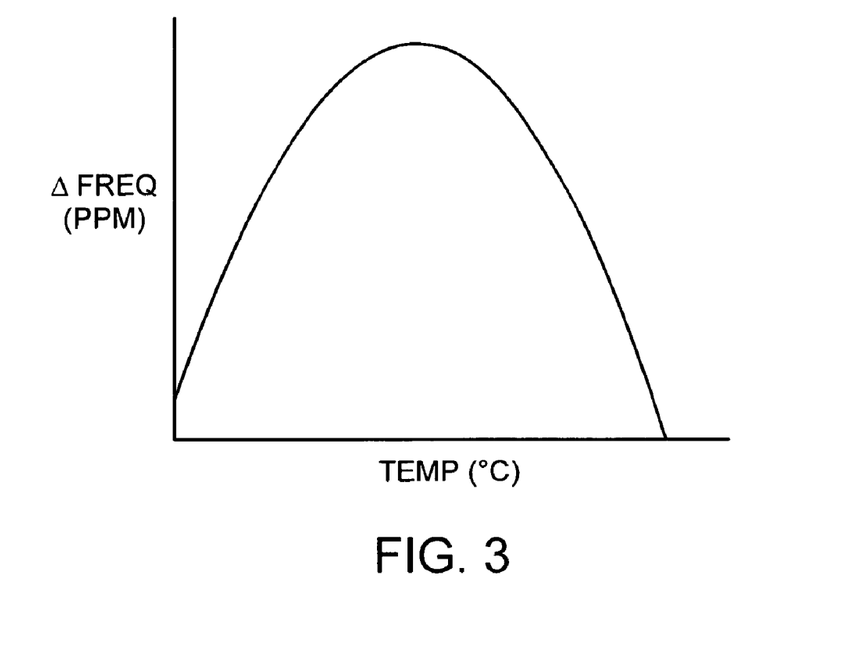
FIG. 3 is a graph of frequency skew counted by an XT-cut quartz crystal when subjected to differing temperatures.
Figure 4:
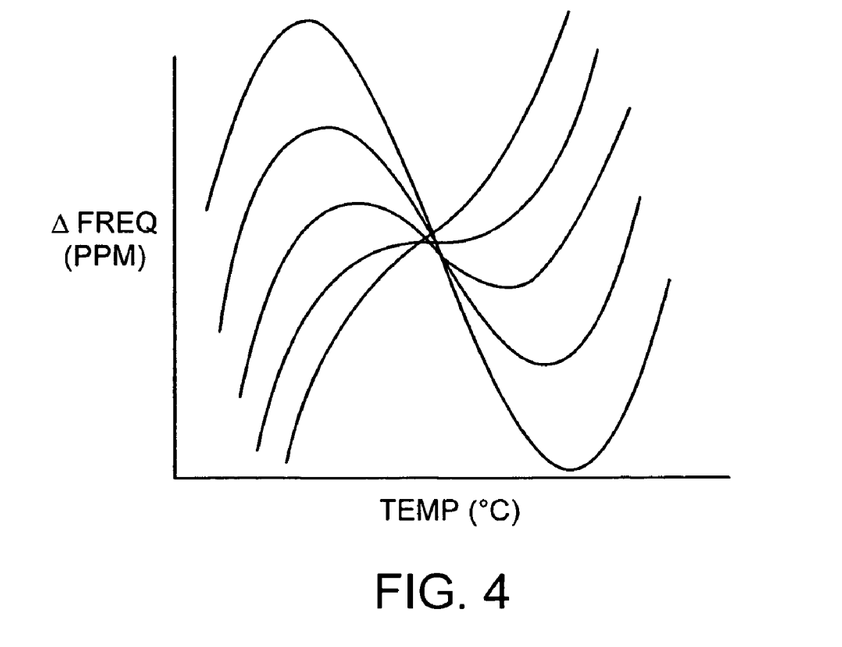
FIG. 4 is graph of frequency skew counted by an AT-cut quartz crystal, along differing cut angles, when subjected to differing temperatures.

FIG. 3 illustrates the frequency dependence of a quartz crystal output relative to changes in temperature. In particular, a quartz crystal cut in the XT dimension will generate an increasing frequency deviation in parts per million (PPM) and, thereafter, a decreasing frequency deviation. FIG. 4 indicates frequency deviation as a function of not only temperature, but also the angle of cut within AT cut quartz crystal. In either instance shown in FIGS. 3 and 4, the frequency deviation can be approximated with one or more equations. Of benefit, the equation can be written as a program that is stored within a memory, and executed upon by a microprocessor or CPU or a state machine.

In addition to the instructions being stored in memory, the result of executing the program can also be stored in the memory as data. The data can form, for example, a lookup table. For every temperature reading taken, for example, a corresponding data value (hereinafter referred to as a "compensated value") can be read from the memory. The memory can store lookup tables for possibly numerous types of resonators if needed, or portions of memory known as banks can be dedicated for each type of resonator if desired. Regardless of how the memory is apportioned or addressed, the memory can contain compensated values that when read will yield, for example, a temperature compensated value that is substantially non-skewed. Thus, while practical crystals will demonstrate substantial frequency fluctuation at different temperatures, the compensated values will have little, if any, skew of frequency across the entire temperature range.

Figure 5:
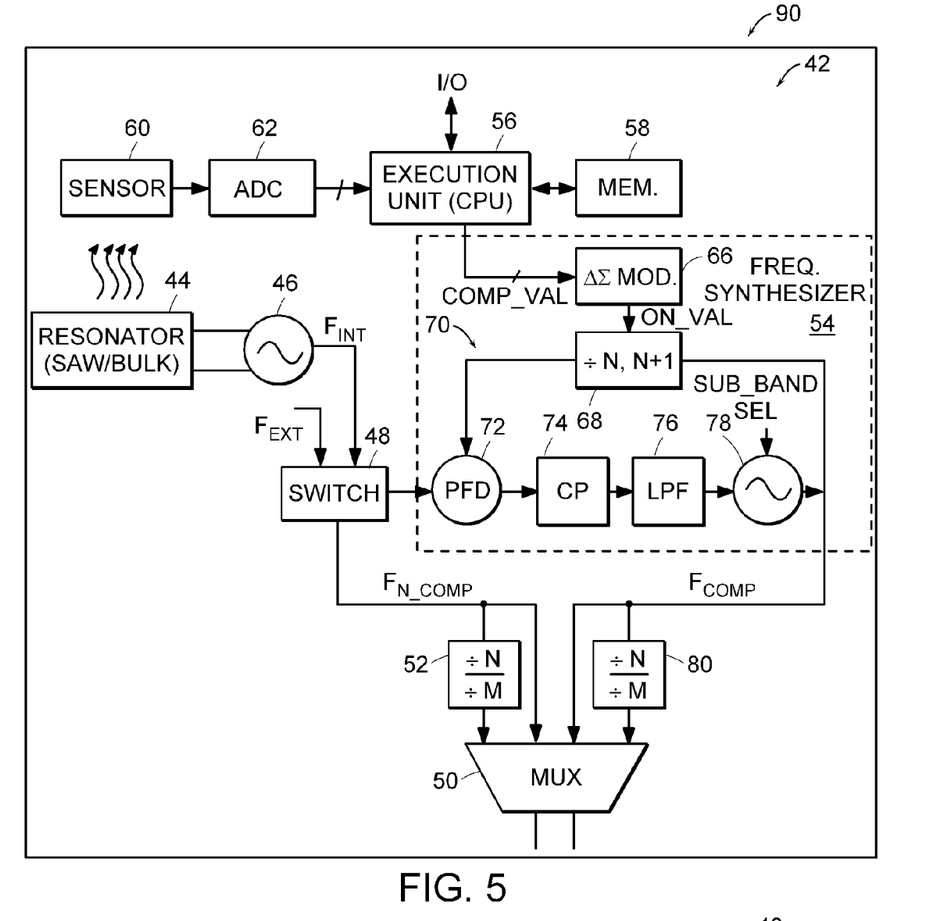
FIG. 5 is a block diagram of a voltage controlled crystal oscillator with skew compensation embodied upon the same monolithic substrate.
Figure 6:
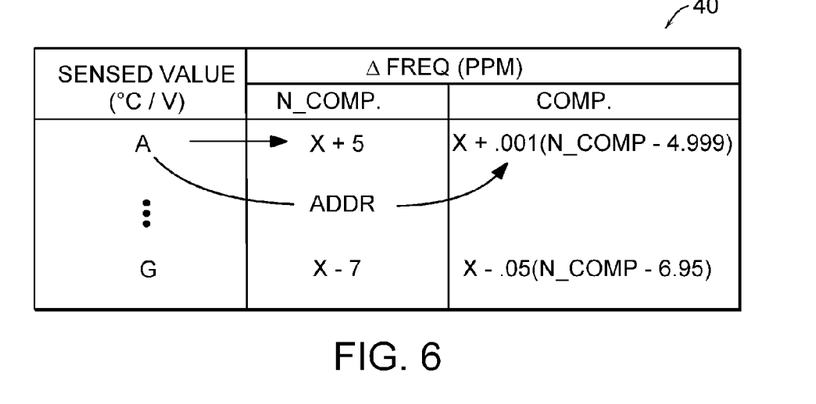
FIG. 6 is a plan diagram of a look-up table stored in the memory of FIG. 5, showing sensed values that address corresponding compensated values used to set an integer or fractional divide-by number within the feedback loop of the PLL in FIG. 5.

FIG. 6 illustrates one example of a lookup table 40 that can be stored in memory. For example, if a sensed value of A is read from the sensor absent any compensation, a corresponding deviation from a non-skewed frequency from that resonator might be X+5; however, by employing a lookup table 40, the read value A will address a compensated value of X+0.001, for example. The compensated value is, therefore, the non-compensated value minus 4.999, in the example shown. Using exemplary real numbers, a sensed value of A might be 25° C. Absent any compensation, the resonator used might produce a frequency of 39 MHz with a deviation of maybe 5 KHz. Knowing the modeled resonator should be as close to 39 Mhz as possible, lookup table 40 will produce a read value for 25° C. (i.e., compensated value) of 39 MHz+0.001 KHz deviation therefrom. Alternatively, the compensated value can be what the temperature should be (i.e., 24.987° C.) rather than the non-compensated read value of 25° C. Therefore, the executed program will model the resonator outcome at different frequencies (or temperatures) and place the targeted or modeled outcome into memory of the lookup table, with data addressable for each temperature read. It is desirable to have the lookup table 40 be large enough to accommodate fairly small increments of the read, conditioned value such as temperature, frequency, or voltage. Resolution can be further increased using a special purpose modulator such as a delta-sigma modulator, shown in FIG. 5.

Referring to FIG. 5, a voltage-controlled and temperature-compensated crystal oscillator 42 is shown. Crystal oscillator 42 includes a crystal resonator 44, which can either be a SAW resonator or a quartz crystal resonator that resonates in the bulk material itself. Coupled to resonator 44 is an amplifier/oscillator circuit 46. Oscillator 46 produces a resonant frequency or a harmonic mode thereof ($F_{INT}$). A switch 48 can be used to select either the internal-derived $F_{INT}$ or an externally driven $F_{EXT}$ signal. It may be that $F_{INT}$ is used as the local master or, alternatively, mastership may be obtained from the external signal $F_{EXT}$ of the locally driven electronic subsystem connected to the output of multiplexer 50. Regardless of which signal is chosen by switch 48, the frequency of the chosen signal will not be compensated, and is labeled as $F_{N\_COMP}$. The non-compensated signal can be fed to dividers or multipliers, or a network thereof which divides or multiplies in integers or fractions, as shown by block 52, prior to insertion into multiplexer 50. Alternatively, the non-compensated signal can be fed directly into multiplexer 50; thus, bypassing the integer and fractional multiplier and divider network 52.

Although the signal from the resonator that is not compensated can be used, a frequency-compensated or temperature-compensated signal can also be used. FIG. 5 illustrates a frequency synthesizer 54 that can receive a compensated value (COMP_VAL) from, for example, an execution unit or CPU 56. CPU 56 can include any type of microprocessor having, for example, an instruction cache and a data cache. The overall architecture of the CPU can also receive instruction and data information onto a decoder, and includes branch, shift, load, and store sub-execution units, along with an arithmetic logic unit or ALU. The execution unit 56 might also include both an integer unit and a floating point unit with a reorder buffer to take into account branch prediction. Execution unit 56 can be either a dedicated microcontroller or a general purpose microprocessor, each of which have a particular instruction set stored in the instruction cache and/or memory 58.

In addition to instructions, memory 58 can receive data. Particularly, the data can be the result of, for example, an algorithm executed by processor 58 to adjust frequency for various read values from sensor 60. Sensor 60 is any form of transducer that converts one form of energy into another. Energy can be represented as temperature, acoustic vibration, or any other form of energy that can be read from resonator 44. Preferably, sensor 60 is coupled directly to resonator 44 and, therefore, integrated onto the substrate with resonator 44. The output from sensor 60 can be fed into an analog-to-digital converter (ADC) 62. ADC converts the analog readings into a digital set of binary values and possibly encoded as several bitstreams placed across a bus, such as a PCI bus of processor 56. The multi-bitstream can directly couple to memory 58 via a memory controller, such as through a DMA transfer or, alternatively, be placed into a data cache associated with processor 56. The data within the cache can then be converted to an address that is forwarded to memory 58 and, specifically, lookup table 40 (FIG. 6) of memory 58.

Once the addressed value extracts the appropriate compensated value from memory 58, the compensated value can then be placed into a modulator. There are numerous types of modulators. One form of modulator is a delta-sigma modulator. As shown in FIG. 5, delta-sigma modulator 66 can oversample the compensated value represented as a plurality of bits sent across the multi-conductor bus. The output from modulator 66 can be represented as a bitstream of a substantially higher baud rate than the compensated value bitstream, and as a series of logic 1 and logic 0 voltage values. Further details of delta-sigma modulation, the compensated value, and the resulting divide value (DW_VAL) are set forth in FIG. 9.

The output from modulator 66 is shown connected to a divider 68. Divider 68 can be an integer or fractional divider, and is preferably represented as a pre-scalar unit or dual-modulous, pre-scalar that implements phase-switching to achieve a divide-by-N, N+1, and ratios thereof. Divider 68 is placed in the feedback loop of a PLL 70. PLL 70 includes a phase frequency detector (PFD) 72, a charge pump 74, a low-pass filter 76, and a voltage-controlled oscillator 78. Details of devices 72–78 are generally well known in PLL design. In addition, details of delta-sigma modulator 66 is also generally known. The benefits of using a delta-sigma modulator is two-fold: (i) to increase the resolution of a divide-by value, and (ii) to place the quantization noise into a band higher than the Nyquist rate so that the quantization noise is more easily removed using a low pass filter, or digital decimation.

The output from voltage-controlled oscillator (VCO) 78 can be sent not only to divider 68, but also to multiplexer 50 or a fractional divider/multiplier circuit 80. Therefore, multiplexer 50 serves as a cross-bar multiplexer which can select any of the various inputs, and place that input on any of the various outputs. A fractional or non-fractional, compensated or non-compensated frequency of an output signal can, therefore, be selected and placed on an appropriate output depending on the chosen application. A sub-band select signal (SUB_BAND SEL) can activate different sub-bands within VCO 78, to possibly select different frequencies of interest beyond frequencies chosen by the divide-by ratio of divider 68, and further in addition to the fractional divide and multiply of circuit 80.

Figure 7:
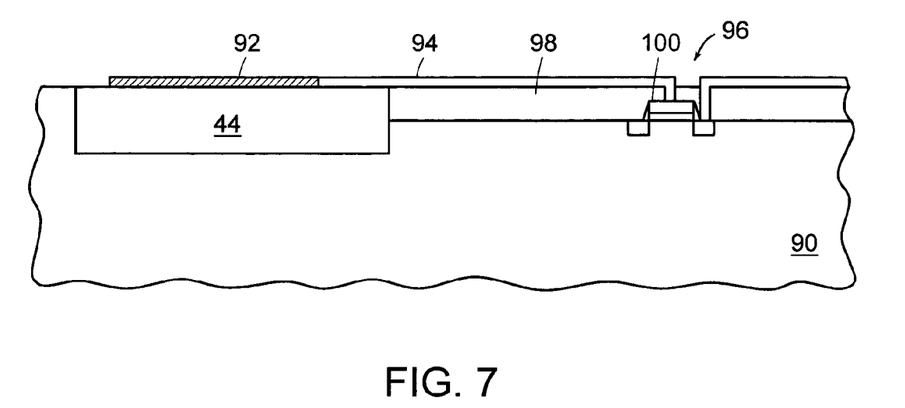
FIG. 7 is a partial cross-sectional view of a monolithic substrate along plane 7—7 of FIG. 2 that forms part of a die, or chip, and wherein the monolithic substrate contains all of the voltage controlled crystal oscillator with skew compensation circuitry.

All of the various components shown in FIG. 5 can be implemented on a single monolithic substrate, such as silicon or gallium arsenide. FIG. 7 illustrates at least a portion of that substrate 90. Formed upon or at least partially within substrate 90 is a resonator material 44. FIG. 7 illustrates the cross-section view along plane 7—7 of FIG. 2 and, specifically, along one tooth of the SAW comb of SAW resonator 44. Behind that tooth, implemented as a metal trace conductor 92, is another tooth connected to the opposing output; that tooth is shown extending as a metal trace conductor 94 to active and passive elements within another portion of substrate 90. Active element 96 is shown, possibly representing a transistor of oscillator 34 (FIG. 2) or oscillator 46 (FIG. 5).

Metal conductor 94 is formed by depositing metal over resonator 44 and field oxide/dielectric 98, and patterning the metal layer to form the IDT of the SAW resonator, as well as trace conductors across active and passive elements of the integrated circuit. Metal conductor 94 can, therefore, extend downward to a gate conductor 100 of transistor 96 to transition transistor 96 and, specifically, the channel between source and drain regions of transistor 96. For sake of brevity, the remaining passive and active elements are not shown in FIG. 7; however, it is understood that the monolithic substrate encompasses all such elements which form a voltage-controlled, temperature-compensated crystal oscillator.

Figure 8:
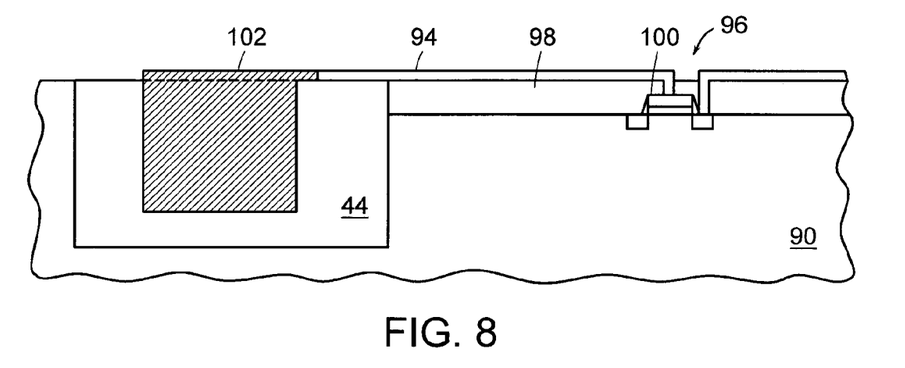
FIG. 8 is a partial cross-sectional view of a monolithic substrate along plane 8—8 of FIG. 2 that forms part of a die, or chip, and wherein the monolithic substrate contains all of the voltage controlled crystal oscillator with skew compensation circuitry.

FIG. 8 illustrates resonator 44 formed as a quartz crystal with plates operating as wire leads internally connected to opposing surfaces of quartz crystal 44. One plate is shown in cross-section as reference numeral 102, along plane 8—8 of FIG. 2. The opposing plate may be on the other face or surface of the quartz crystal. A patterned metal conductor 104 extends from plate 102 of resonator 104 across field dielectric 98, as conductive trace element 94. Conductor 94 can contact a gate conductor 100 of transistor 96, similar to that shown in FIG. 7.

FIGS. 7 and 8 illustrate formation (deposition, selective etch, and/or polishing) of resonator materials to form a resonator with a semiconductor fabrication tool, similar to the formation of active and passive elements that form the overall integrated circuit die. A quartz crystal can be formed, for example, using various chemical vapor deposition techniques. Likewise, the GaAs, $LiNbO_3$, $LiTaO_3$, and ZnO materials of a SAW resonator can also be formed using various fabrication tools and deposition techniques.

Figure 9:
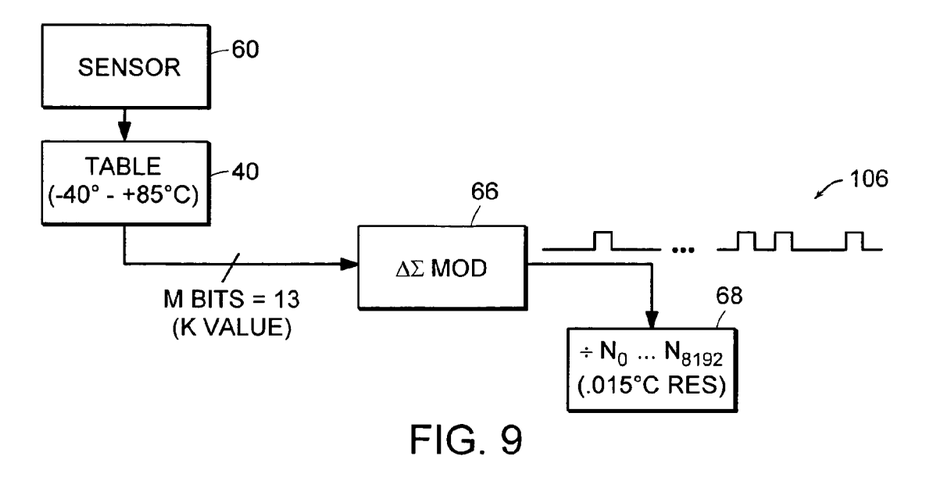
FIG. 9 is a block diagram of a portion of FIG. 5 and, particularly, a sensor that senses a performance-skewing, condition value (e.g., temperature or chemical ambient of an environment or fabrication processing skews) of a resonator, a lookup table within memory that produces a compensated value for each sensor-read condition value, a delta-sigma modulator that oversamples and modulates the compensated value to produce of divide-by values to account for relatively small skew amounts.

FIG. 9 illustrates one form of modulation, known as delta-sigma modulation, of delta-sigma modulator 66. Modulator 66 can receive, for example, M bits of data having a K value. The K value is alternatively known as a compensated value taken from a lookup table 40. Table 40 produces the compensated value in response to an addressing signal sent from sensor 60. Thus, instead of sending, for example, a frequency of 39.05 MHz when a temperature of 25° C. is encountered, table 40 produces a compensated value of 39 MHz, more similar to the ideal frequency for that temperature. Table 40 thereby includes compensated values for all temperatures between −40° C. to +85° C., for example. If M bits=13, for example, then modulator 66 will produce a single bit of logic 1 or logic 0 voltage values patterns, signaling the following divide logic to dither the output (increment or decrement the count at a given rate). The string of logic 1 and logic 0 voltage values are shown as item 106, and represent essentially all logic 0 voltage values at the least magnitude to all logic 1 voltage values at the most magnitude. For example, if M=13, then the divide-by number can be either $N_0$ to $N_{8192}$ to represent the full range of temperature values of approximately 125° C./8192 or a resolution of 0.015° C. Alternatively, if divider 68 is a fractional divider, then modulator 66 will send a fractional count of logic 1 to logic 0 voltage values that determine the amount by which the integer divide-by value is increased as a proportion of the 1-to-0 logic values within each 13-bit pattern. FIG. 9 thereby indicates a higher resolution output using a delta-sigma modulator to receive the compensated value and produce the bi-value onto the integer or fractional divider 68.

The present voltage-controlled and temperature-compensated crystal oscillator can operate as a universal oscillator replacement circuit configured on a single die or chip, and containing the crystal itself. The universal oscillator replacement circuit can replace crystal oscillators, voltage-controlled crystal oscillators, temperature-controlled crystal oscillators, SAW oscillators, voltage-controlled SAW oscillators, and temperature-controlled SAW oscillators or a full frequency synthesizer. The oscillator replacement circuit can involve a lesser number of parts and part counts for a product, giving improved manufacturing and flexibility, improved performance, lower space required due to no external components, and a smaller overall package. Further advantages of the replacement circuit include the fact that it may be system programmable, mask programmable, or one-time programmable. The replacement circuit may use single resonators for all frequencies, and may offer programmable, selectable, and continuous output frequency resolution and temperature correction. The replacement circuit may be used for coherence clocking and synchronization, may require less power than conventional solutions, and offer improved noise performance over conventional solutions.

The replacement circuit is preferably placed on a single die, but also can be placed on multiple dies, where the resonator is separated from the oscillator/amplifier compensating circuit. The replacement circuit thereby allows configurability such that it can replace any of the single or multiple existing functions served by oscillators, such as XO, SO, TCXO, TCSO, VCXO, and/or VXSO.

The delta-sigma modulator and divider circuitry is suitable for use in a frequency synthesizer that employs a PLL portion to achieve small step size without degrading phase noise, a common weakness of most PLL designs. Temperature correction is achieved by either exploiting the fine resolution in the PLL, lookup table, or adjusting dynamically by analog or a combination of analog and digital mechanisms. No dedicated components are needed beyond the temperature sensor. The correction profile can be stored in non-volatile memory and can be tailored to different applications through software.

The various circuit features set forth in the present disclosure are not to be interpreted as reflecting all possible features of the claimed invention. The specification and drawings are, therefore, to be regarded in an illustrative rather than a restrictive sense.

What is claimed is:

1. An oscillator, comprising:
   a monolithic substrate;
   a resonator arranged in a first portion of the substrate;
   a sensor arranged in a second portion of the substrate for sensing a condition value at which the resonator produces a resonating signal;
   a frequency synthesizer arranged in a third portion of the substrate for receiving the resonating signal and the condition value and for modifying a frequency of the resonating signal based on the condition value, wherein the frequency synthesizer comprises:
   an array of storage elements addressable by the condition value to produce a compensated value;
   a modulator coupled to receive the compensated value and produce a divide-by value;
   a divider coupled within the feedback path of a phase-locked loop for receiving the divide-by value; and
   a voltage controlled oscillator also coupled within the feedback path for producing the frequency modified output.

2. The oscillator as recited in claim 1, wherein the monolithic substrate comprises single crystal silicon or gallium arsenide diced from a wafer.

3. The oscillator as recited in claim 1, wherein the resonator comprises a piezoelectric material deposited from a semiconductor fabrication tool onto or into the first portion.

4. The oscillator as recited in claim 3, wherein the piezoelectric material is selected from a group consisting of quartz, $LiNbO_3$, $LiTaO_3$, ZnO and AlN.

5. The oscillator as recited in claim 1, further comprising a transducer coupled to at least one surface of the resonator to measure elastic deformation of surface acoustic waves extending along said surface.

6. The oscillator as recited in claim 1, further comprising a transducer coupled to at least one surface of the resonator to measure elastic deformation of bulk acoustic waves that arrive upon said surface from another surface.

7. The oscillator as recited in claim 1, wherein said sensor is a temperature sensor for sensing a temperature condition value of the resonator.

8. The oscillator as recited in claim 1, wherein said sensor is a fabrication process sensor for sensing a fabrication condition value of at which the resonator was manufactured.

* * * * *